United States Patent
Trzasko et al.

(10) Patent No.: US 12,044,764 B2
(45) Date of Patent: Jul. 23, 2024

(54) MODEL-BASED NYQUIST GHOST CORRECTION FOR REVERSE READOUT ECHO PLANAR IMAGING

(71) Applicant: Mayo Foundation for Medical Education and Research, Rochester, MN (US)

(72) Inventors: Joshua D. Trzasko, Rochester, MN (US); Uten Yarach, Rochester, MN (US); Matthew A. Bernstein, Rochester, MN (US); Myung-Ho In, Rochester, MN (US); Yi Sui, Rochester, MN (US)

(73) Assignee: Mayo Foundation for Medical Education and Research, Rochester, MN (US)

( * ) Notice: Subject to any disclaimer, the term of this patent is extended or adjusted under 35 U.S.C. 154(b) by 122 days.

(21) Appl. No.: 17/781,660

(22) PCT Filed: Dec. 1, 2020

(86) PCT No.: PCT/US2020/062712
§ 371 (c)(1),
(2) Date: Jun. 1, 2022

(87) PCT Pub. No.: WO2021/113242
PCT Pub. Date: Jun. 10, 2021

(65) Prior Publication Data
US 2022/0413078 A1 Dec. 29, 2022

Related U.S. Application Data

(60) Provisional application No. 62/942,184, filed on Dec. 1, 2019.

(51) Int. Cl.
*G01V 3/00* (2006.01)
*G01R 33/561* (2006.01)
*G01R 33/565* (2006.01)

(52) U.S. Cl.
CPC ... *G01R 33/56554* (2013.01); *G01R 33/5616* (2013.01)

(58) Field of Classification Search
CPC .......... G01R 33/3415; G01R 33/543; G01R 33/5659; G01R 33/36; A61B 5/055
(Continued)

(56) References Cited

U.S. PATENT DOCUMENTS 4,837,513 A * 6/1989 Yao .................. G01R 33/561
324/309
6,259,250 B1 7/2001 Mock
(Continued)

FOREIGN PATENT DOCUMENTS

WO WO-2016032823 A1 * 3/2016 ......... G01R 33/5611
WO WO-2017181200 A1 * 10/2017 ............. A61B 3/101

OTHER PUBLICATIONS

International Search Report of related PCT/US2020/062712, mailed on Feb. 26, 2021, 4 pages.
(Continued)

*Primary Examiner* — Walter L Lindsay, Jr.
*Assistant Examiner* — Frederick Wenderoth
(74) *Attorney, Agent, or Firm* — Quarles & Brady LLP (57) ABSTRACT

Nyquist ghost artifacts in echo planar imaging ("EPI") are mitigated, reduced, or otherwise eliminated by implementing robust Nyquist ghost correction ("NGC") directly from two reversed readout EPI acquisitions. As one advantage, these techniques do not require explicit reference scanning.
(Continued)

A model-based process is used for directly estimating statistically optimal NGC coefficients from multi-channel k-space data.

19 Claims, 7 Drawing Sheets

(58) Field of Classification Search
USPC .......................................................... 324/309
See application file for complete search history.

(56) References Cited

U.S. PATENT DOCUMENTS

| | | | |
|---|---|---|---|
| 7,102,352 B2 | 9/2006 | Hinks et al. | |
| 7,888,935 B1* | 2/2011 | Tan ................. | G01R 33/56518 |
| | | | 324/309 |
| 2011/0148413 A1* | 6/2011 | Miyazaki ........... | G01R 33/5635 |
| | | | 324/309 |
| 2016/0146915 A1* | 5/2016 | Mailhe ............... | G01R 33/5611 |
| | | | 324/309 |
| 2016/0231409 A1* | 8/2016 | Taviani .............. | G01R 33/5611 |
| 2017/0276755 A1* | 9/2017 | Hoge ................. | G01R 33/5611 |

OTHER PUBLICATIONS

Written Opinion of related PCT/US2020/062712, mailed on Feb. 26, 2021, 9 pages.
Bernstein M.A., King K.F., and Zhou X.J, Handbook of MRI Pulse Sequences 2004; Burlington, MA, USA: Elsevier.
Bertram, et al. Gradient Response Harvesting for Continuous System Characterization During MR Sequences 11, IEEE Transactions on Medical Imaging, IEEE Service Center, Piscataway, NJ, us, vol. 39, No. 3, Aug. 19, 2019 (Aug. 19, 2019), pp. 806-815, XP011775612, ISSN: 0278-0062, DOI: 10.1109/TMI.2019.2936107.
Foo TKF, Laskaris E, Vermilyea M, et al. Lightweight, compact, and high-performance 3T MR system for imaging the brain and extremities. Magn Reson Med 2018; 80(5): 2232-2245.
Golub GH, Pereyra V. Differentiation of pseudo-inverses and non-linear least-squares problems whose variables separate. SIAM J Numer Anal 1973; 10:413-432.
Hoge, W. S., et al. Dual-polarity GRAPPA for simultaneous reconstruction and ghost correction of echo planar imaging data. Magn Reson Med. 2016; 76: 32-44.
Hu, X., et al. Artifact reduction in EPI with phase-encoded reference scan. Magn Reson Med 1996; 36, 166-171.
Jin, K.H., et al. A general framework for compressed sensing and parallel mri using annihilating filter based low-rank hankel matrix. IEEE Trans. Comput. Imag. 2016; 2(4): 480-495.
Mansfield P. Multi-planar image formation using NMR spin-echoes. J Phys C. 1977; 10:L55-L58.
Porter D.A., Calamante F., Gadian D.G., and Connelly A. The effect of residual Nyquist ghost in quantitative echo-planar diffusion imaging. Magn Reson Med 1999; 42(2): 385-392.
Reeder S.B., Faranesh A.Z., Atalar E., and McVeigh E.R. A novel object-independent balanced reference scan for echo-planar imaging. J Magn Reson Imaging 1999; 9(6): 847-852.
Skare S., Newbould r., Clayton D., Bammer R., and Moseley M. A fast and robust minimum entropy based non-interactive nyquist ghost correction algorithm. in Proc. Int. Soc. Magn Reson Med 2006; pp. 2349.
Uten, et al. "Model-Based Iterative Reconstruction for Echo Planar Imaging: Methods and Applications", 2019 53rd Asilomar Conference on Signals, Systems, and Computers, IEEE, Nov. 3, 2019 (Nov. 3, 2019), pp. 61-64, XP033750653, DOI: 10.1109/IEEECONF44664.2019.9048792.
Van der Zwaag W., Marques J.P., Lei H., Just N., Kober T., and Gruetter R. Minimization of Nyquist ghosting for echo-planar imaging at ultra-high fields based on a "negative readout gradient" strategy. Magn Reson Med 2009; 30 (5):1171-1178.

* cited by examiner

MODEL-BASED NYQUIST GHOST CORRECTION FOR REVERSE READOUT ECHO PLANAR IMAGING

CROSS-REFERENCE TO RELATED APPLICATIONS

This application represents the national stage entry of PCT/US2020/062712 filed on Dec. 1, 2020 and claims the benefit of U.S. Provisional Patent Application Ser. No. 62/942,184, filed on Dec. 1, 2019, and entitled "MODEL-BASED NYQUIST GHOST CORRECTION FOR REVERSE READOUT ECHO PLANAR IMAGING," the contents of which is incorporated herein by reference as if set forth in its entirety for all purposes.

STATEMENT REGARDING FEDERALLY SPONSORED RESEARCH

This invention was made with government support under EB024450 awarded by the National Institutes of Health. The government has certain rights in the invention.

BACKGROUND

Nyquist ghosting is a common artifact in echo planar imaging ("EPI"). This artifact is caused by a number of factors, including readout gradient-induced low-order eddy currents and receive chain imperfections (e.g., group delay). These effects impart phase modulations whose polarity alternates with readout direction (i.e., even or odd), which causes the generation of "ghosts" to appear at half field-of-view ("FOV") intervals.

Ghost artifacts degrade image interpretability and compromise quantitative measurement validity. Although single-polarity reference scan-based paradigms are routinely used to mitigate Nyquist ghosting, they often fail to fully suppress the artifacts because of statistical biases in estimated correction coefficients that result from noise and off-resonance effects. Prior works have shown that the use of dual polarity reference scans can mitigate the latter effects.

SUMMARY OF THE DISCLOSURE

The present disclosure addresses the aforementioned drawbacks by providing a method for generating Nyquist ghost corrected magnetic resonance data. The method includes accessing magnetic resonance data with a computer system. The magnetic resonance data are acquired from a subject with a magnetic resonance imaging (MRI) system using a reversed readout polarity echo planar imaging (EPI) acquisition. A signal model is also accessed with the computer system. The signal model includes a system response function that includes system response parameters associated with phase modulations corresponding to Nyquist ghost artifacts. A cost function is constructed with the computer system, wherein the cost function is based on the signal model. Estimated system response parameter values are generated by inputting the magnetic resonance data to the cost function and minimizing the cost function with the computer system, generating output as the estimated system response parameter values. Nyquist ghost corrected data are then generated with the computer system using the estimated system response parameter values.

It is another aspect of the present disclosure to provide a method for generating corrected magnetic resonance data. The method includes accessing magnetic resonance data with a computer system. The magnetic resonance data are acquired from a subject with a magnetic resonance imaging (MRI) system using a reversed readout polarity echo planar imaging (EPI) acquisition. A signal model is also accessed with the computer system. The signal model includes a system response function that models phase modulations corresponding to one or more artifacts. A cost function is constructed with the computer system, wherein the cost function is based on the signal model. Estimated system response parameter values are generated by inputting the magnetic resonance data to the cost function and minimizing the cost function with the computer system, generating output as the estimated system response parameter values. Corrected data are then generated with the computer system using the estimated system response parameter values.

The foregoing and other aspects and advantages of the present disclosure will appear from the following description. In the description, reference is made to the accompanying drawings that form a part hereof, and in which there is shown by way of illustration a preferred embodiment. This embodiment does not necessarily represent the full scope of the invention, however, and reference is therefore made to the claims and herein for interpreting the scope of the invention.

DETAILED DESCRIPTION

Described here are systems and methods for mitigating, reducing, or otherwise eliminating Nyquist ghost artifacts in echo planar imaging ("EPI") by implementing robust Nyquist ghost correction ("NGC") directly from two reversed readout EPI acquisitions. As one advantage, the techniques described in the present disclosure do not require explicit reference scanning. In general, a model-based process for directly estimating statistically optimal NGC coefficients from multi-channel k-space data is implemented.

Figure 1:
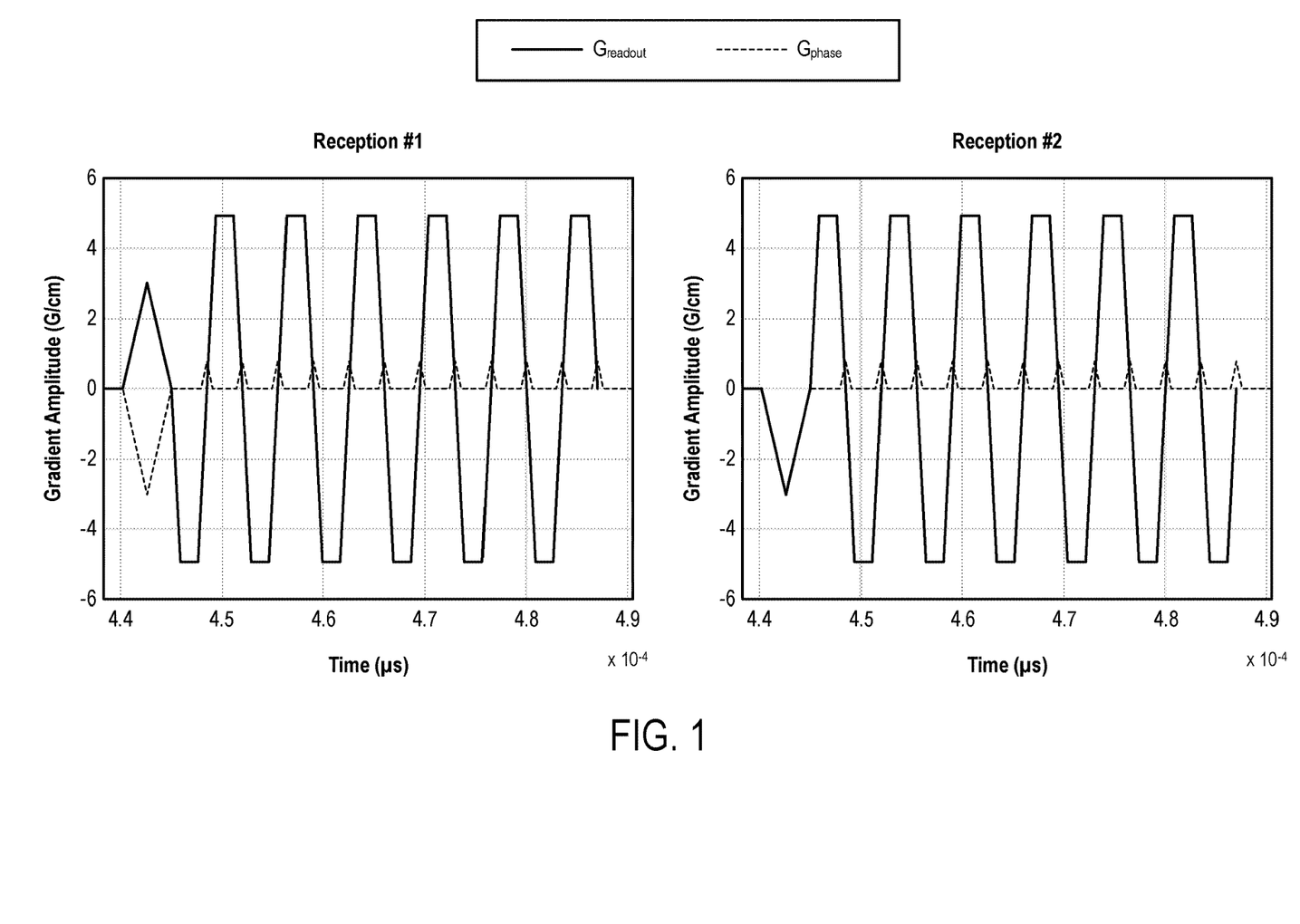
FIG. 1 shows an example of readout gradients that can be used in a reversed readout polarity EPI acquisition. In the reversed readout polarity EPI acquisition, the first pass utilizes the standard gradient time courses while the second pass utilizes an opposite polarity readout gradient. When considered together, no reference scan is required.

As noted, the methods described in the present disclosure make use of a reverse readout polarity EPI acquisition. In general, a reverse readout polarity EPI acquisitions includes performing two phase-encoded EPI acquisitions whose readout gradient polarities have opposite sign at onset. An example of these readout gradients is illustrated in FIG. 1. After temporally Fourier transforming the acquired data (i.e., the raw EPI dataset) along the readout direction, which may be done before ramp resampling, the mth sample of the nth readout line of an EPI acquisition can be modeled as, $$g_{n,\pm}[m,c] = H_{n,\pm}(\alpha,\beta)[m]f_n[m,c] + \varepsilon_{n,\pm}[m,c] \quad (1);$$

where c is the coil index, "±" denotes the readout gradient polarity, $H_{n,\pm}[m] = e^{\pm(-1)^n j(\alpha m + \beta)}$ is the system response function, $\alpha$ and $\beta$ are unknown system coefficients, $f_n[m,c]$ is the actual k-space signal, and $\varepsilon_\pm$ is noise (e.g., zero-mean Gaussian noise with (C×C) coil covariance, $\Psi$). The reversed readout data set can be written in an ensemble form (2M×C) as:

$$g_n = \begin{bmatrix} g_{n,+} \\ g_{n,-} \end{bmatrix} = \left( I \otimes \begin{bmatrix} H_{n,+}(\alpha,\beta) \\ H_{n,-}(\alpha,\beta) \end{bmatrix} \right) f_n + \begin{bmatrix} E_{n,+} \\ E_{n,-} \end{bmatrix} = \Phi_n(\xi) f_n + \varepsilon_n; \quad (2)$$

where $\xi = [\alpha\ \beta]^T$ and "$\otimes$" is Kronecker's product.

The system coefficient vector, $\xi$, and unmodulated k-space signal, f, can be determined from Eqn. (2) via suitable optimization techniques, such as maximum likelihood ("ML") estimation, which as one example can include solving the following minimization problem:

$$\min_{f \in \mathbb{C}, \xi \in \mathbb{R}} \left\{ J(f, \xi) \triangleq \sum_{n=1}^{N} \|\Phi_n(\xi) f_n - g_n\|_{\Psi^{-1}}^2 \right\}. \quad (3)$$

The optimizing k-space signal estimate is, $$f_n = \frac{1}{2}\Phi_n^*(\xi) g_n,$$

where "*" denotes the Hermitian transpose. Variable projection ("VARPRO") of f into J(·) reduces the dimensionality of Eqn. (3) to:

$$\min_{\xi \in \mathbb{R}} \left\{ J(\xi) \triangleq \sum_{n=1}^{N} \left\| \left( \frac{1}{2}\Phi_n(\xi)\Phi_n^*(\xi) - I \right) g_n \right\|_{\Psi^{-1}}^2 \right\} = \quad (4)$$

$$\min_{\xi \in \mathbb{R}} \left\{ J(\xi) \triangleq \sum_{m=1}^{M} |u[m]| \cos\left(2\delta_m^T B\xi - \angle u[m]\right) \right\};$$

where $\delta_m$ denotes Kronecker's delta, B is an M×2 Vandermonde submatrix, $K_n = g_{n,+}\Psi^{-1}g_{n,-}^*$, and the sufficient statistic is given by the following, $$u[m] = \sum_{n,\text{even}} K_n[m,m] + \sum_{n,\text{odd}} \overline{K_n[m,m]}. \quad (5)$$

In one non-limiting example, minimizers of this non-convex cost can be found by preconditioned gradient descent:

$$\xi_{t+1} = \xi_t - P^{-1}\nabla J(\xi_t) \quad (6);$$

with dense preconditioner, $$P = 4B^T \left( \sum_m |u[m]|\delta_m \delta_m^T \right) B; \quad (7)$$

using the magnitude weighted least squares ("MWLS") approximation of Eqn. (4) applied to $\angle u[m]$ following 1D phase unwrapping ("PUN") as an initial estimate. Following the estimation of $\xi$, the unmodulated k-space signal, f, can be readily determined using the above expression.

Figure 2:
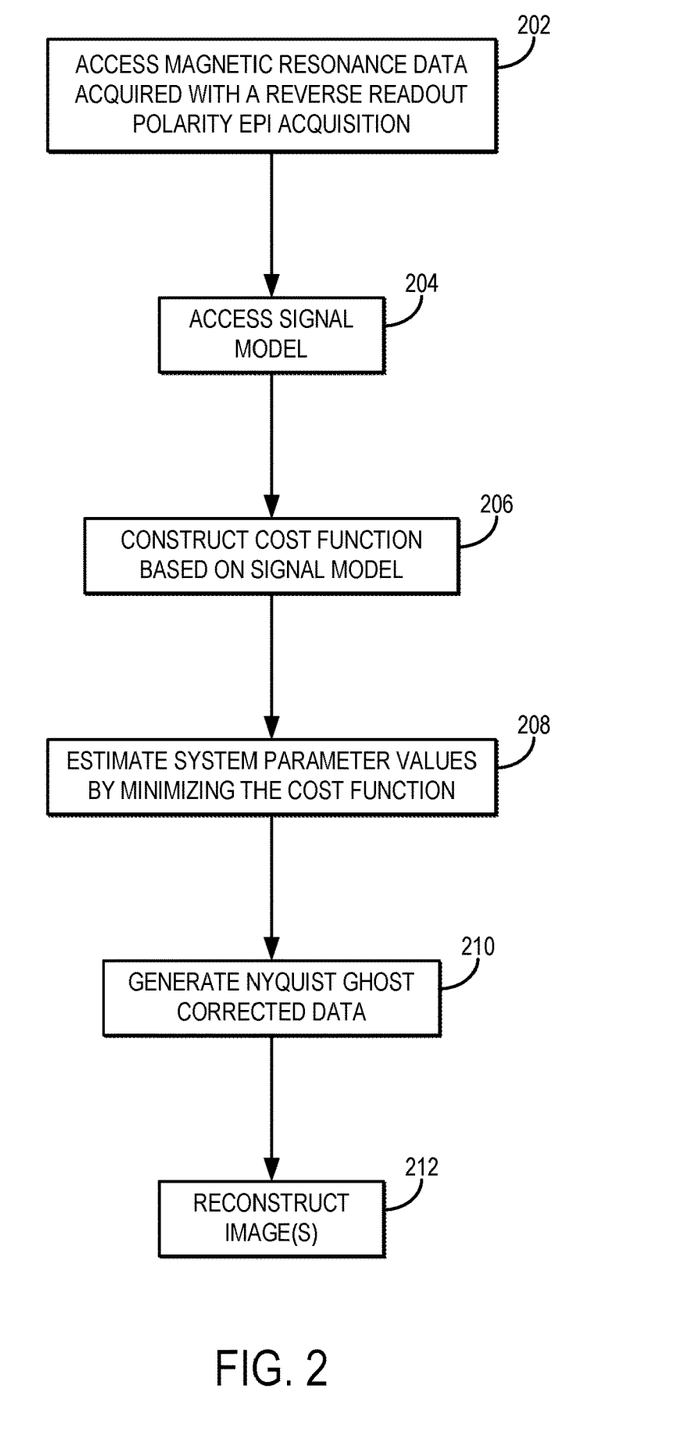
FIG. 2 is a flowchart setting forth the steps of an example method for model-based Nyquist ghost correction using data acquired using a reversed readout polarity EPI acquisition.

Referring now to FIG. 2, a flowchart is illustrated as setting forth the steps of an example method for implementing a model-based Nyquist ghost correction. The method includes accessing magnetic resonance data with a computer system, as indicated at step 202. Accessing the magnetic resonance data can include retrieving previously acquired data from a memory or other suitable data storage device or medium. In other instances, accessing the data may include acquiring such data with a magnetic resonance imaging ("MRI") system and transferring or otherwise communicating the data to the computer system, which in some implementations may be a part of the MRI system.

In either instance, the magnetic resonance data are acquired using a reverse readout polarity EPI acquisition, in which two phase-encoded EPI acquisitions whose readout gradient polarities have opposite sign at onset are performed. An example of readout gradients that can be used in such an acquisition is illustrated in FIG. 1. In a reversed readout polarity EPI acquisition, the first pass utilizes the standard gradient time courses while the second pass utilizes an opposite polarity readout gradient. When these passes are considered together, no reference scan is required.

A signal model is then accessed with the computer system, as indicated at step 204. As one example, the signal model of Eqns. (1) or (2) can be used. In general, the example signal model will model each sample of each readout line of the EPI acquisition, and will thus separately model the positive and negative polarity acquisitions. The signal model also includes a system response function that accounts for an MRI system response that is based on unknown system coefficients. For instance, the system response function can account for the phase modulations imparted during each EPI readout. Thus, a different system response function for each readout polarity can be used.

A cost function is then constructed based on the signal model, as indicated at step 206. The cost function can, in some instances, include a difference between the phase modulated k-space data (i.e., the acquired data) and the unmodulated k-space data (i.e., the target, Nyquist ghost corrected data) modulated by the system response function (s). For example, the cost functions, $J(\xi)$ in Eqns. (3) or (4) can be constructed.

The acquired magnetic resonance data are then input to the cost function and the cost function is minimized over the unknown system parameters, generating output as estimated system parameter values, as indicated at step 208. This minimization problem can be solved as described above, or by using other suitable minimization or optimization techniques.

Using the estimated system parameter values, the magnetic resonance data can be corrected for phase modulations associated with Nyquist ghosting artifacts, as indicated at step 210. For example, the magnetic resonance data and the system parameter values can be input to the system response function used in the accessed signal model (or the signal model itself), generating output as Nyquist ghost corrected data.

One or more images can then be reconstructed from the Nyquist ghost corrected data, as indicated at step 212. The images can be reconstructed using any suitable image reconstruction technique. For instance, a parallel image reconstruction technique, such as root-sum-of-squares ("RSS") or SENSE can be used. In some instances, the Nyquist ghost correction can be incorporated into an iterative reconstruction scheme, such that the Nyquist ghost correction is iteratively performed while the images are being iteratively reconstructed.

Figure 3A:
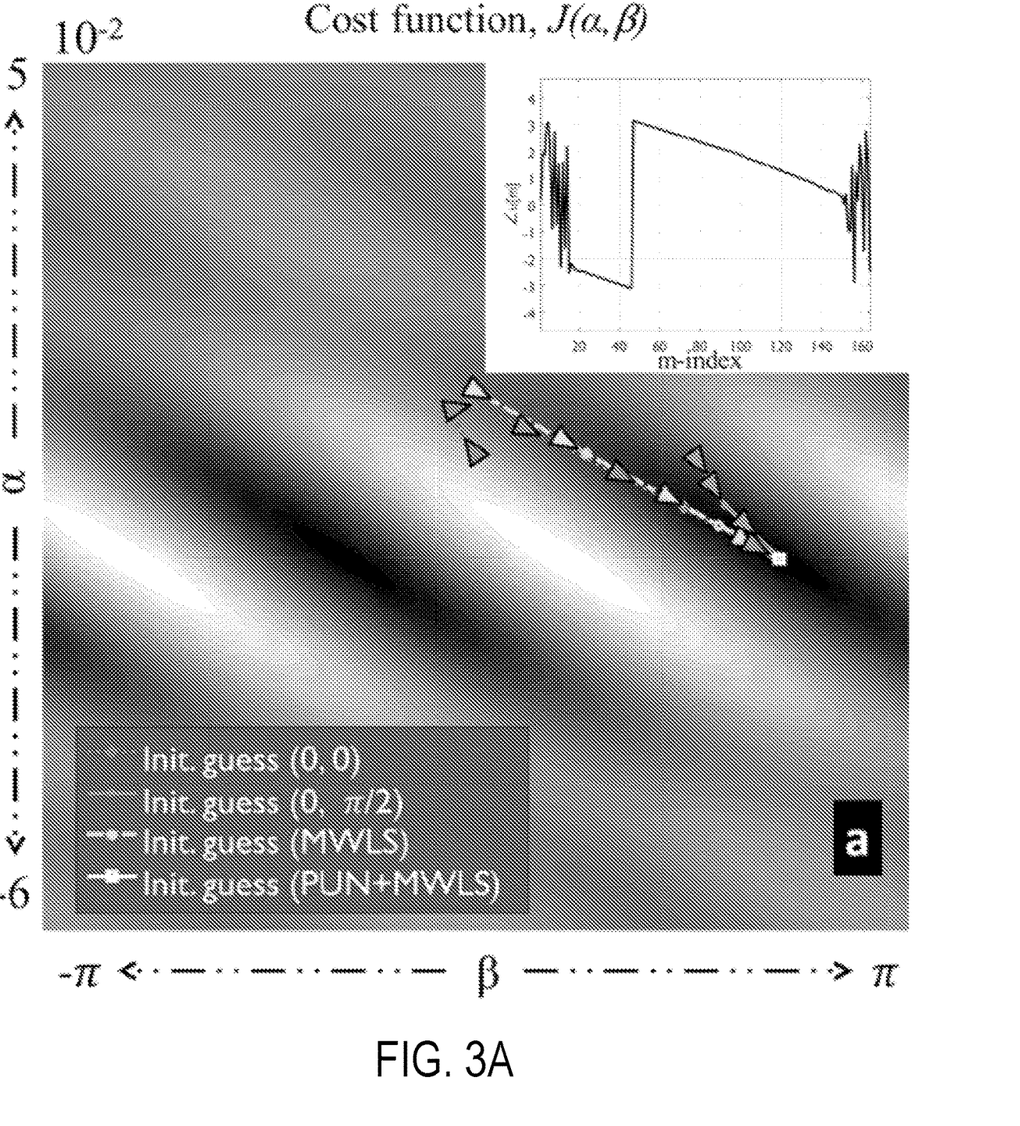
FIGS. 3A and 3B show examples of cost function spaces for two different example data sets (sufficient statistic phase ($\angle u[m]$) shown in inset) evaluated at different $\alpha$ and $\beta$ values. Gradient descent convergence plots for various initial guesses are highlighted by different colors.
Figure 3B:
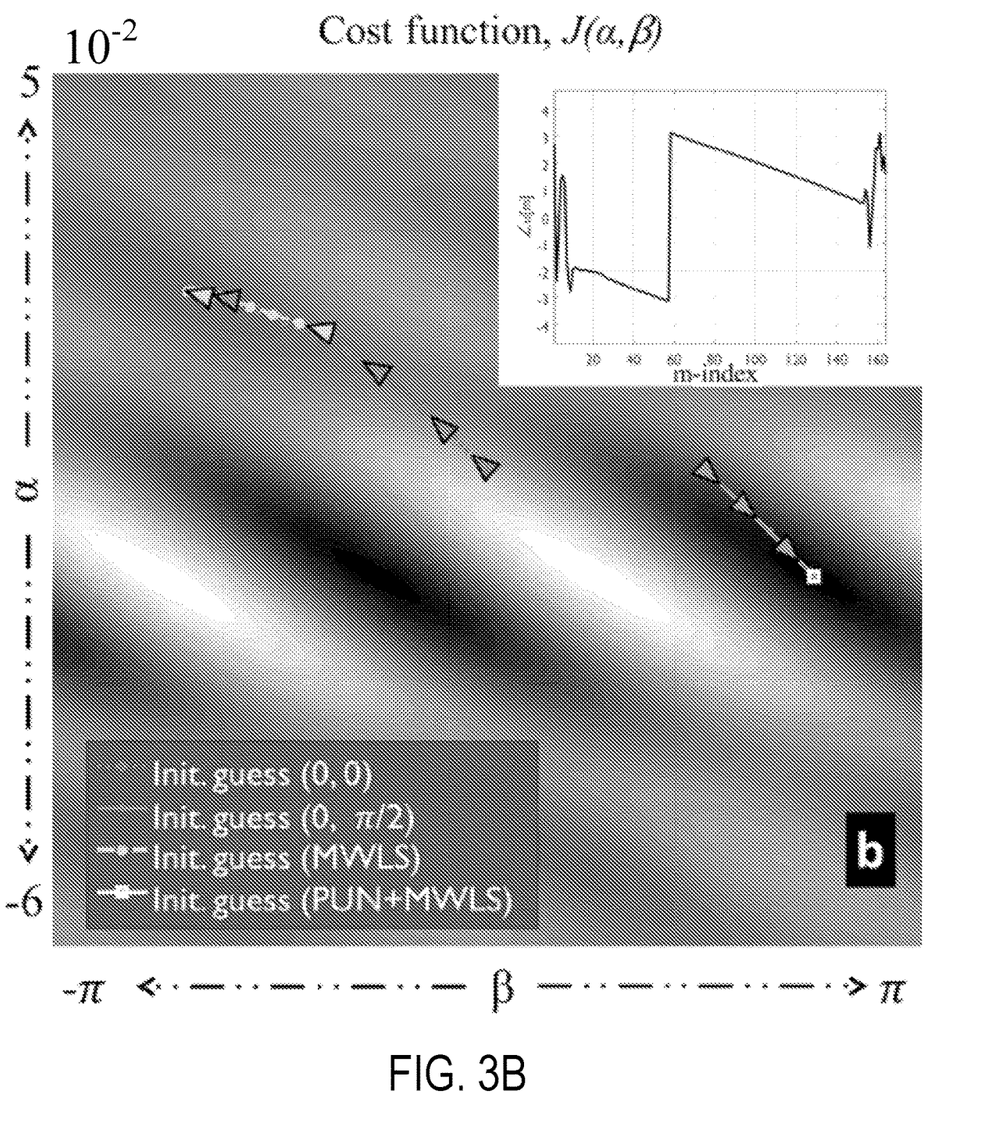

FIGS. 3A and 3B show two examples of non-convex cost function spaces, J(ξ) which contain many local and global extrema. Plots of the pre-PUN sufficient statistic ∠u[m] are shown in the subfigures. Overlaid convergence plots (color) demonstrate the impact of initial guess selection on convergence rate and attraction. Utilizing the MWLS result for the unwrapped sufficient statistic (PUN+MWLS) provides rapid convergence to (non-unique) global minima, as compared to the non-unwrapped MWLS and fixed-value initializations (0, π).

The systems and methods for Nyquist ghost correction that are described in the present disclosure enable improved artifact mitigation relative to standard paradigms (e.g., reference scan-based paradigms) in both phantom and in-vivo brain experiments, and across acceleration rates. This improvement can be attributed, in part, to the optimal noise management and prospective avoidance of off-resonance biases in the proposed approach. Although the systems and methods described in the present disclosure use a two-pass acquisition, these techniques can be combined with higher acceleration factors, or incorporated into multi-pass EPI sequences (e.g., diffusion weighted imaging), in order to minimize or eliminate additional overhead above conventional setups.

With appropriate generalization, the robust physics-driven paradigm described in the present disclosure can serve as a platform for managing complex ghosting artifacts due to other factors, including anisotropic gradient delays; cross-term and higher-order readout eddy currents; and encoding gradient eddy currents (e.g., diffusion lobes). The performance of the systems and methods described in the present disclosure may also be adapted by using target-dependent regularizations or constraints, such as minimum entropy regularization or linear predictability.

Figure 4:
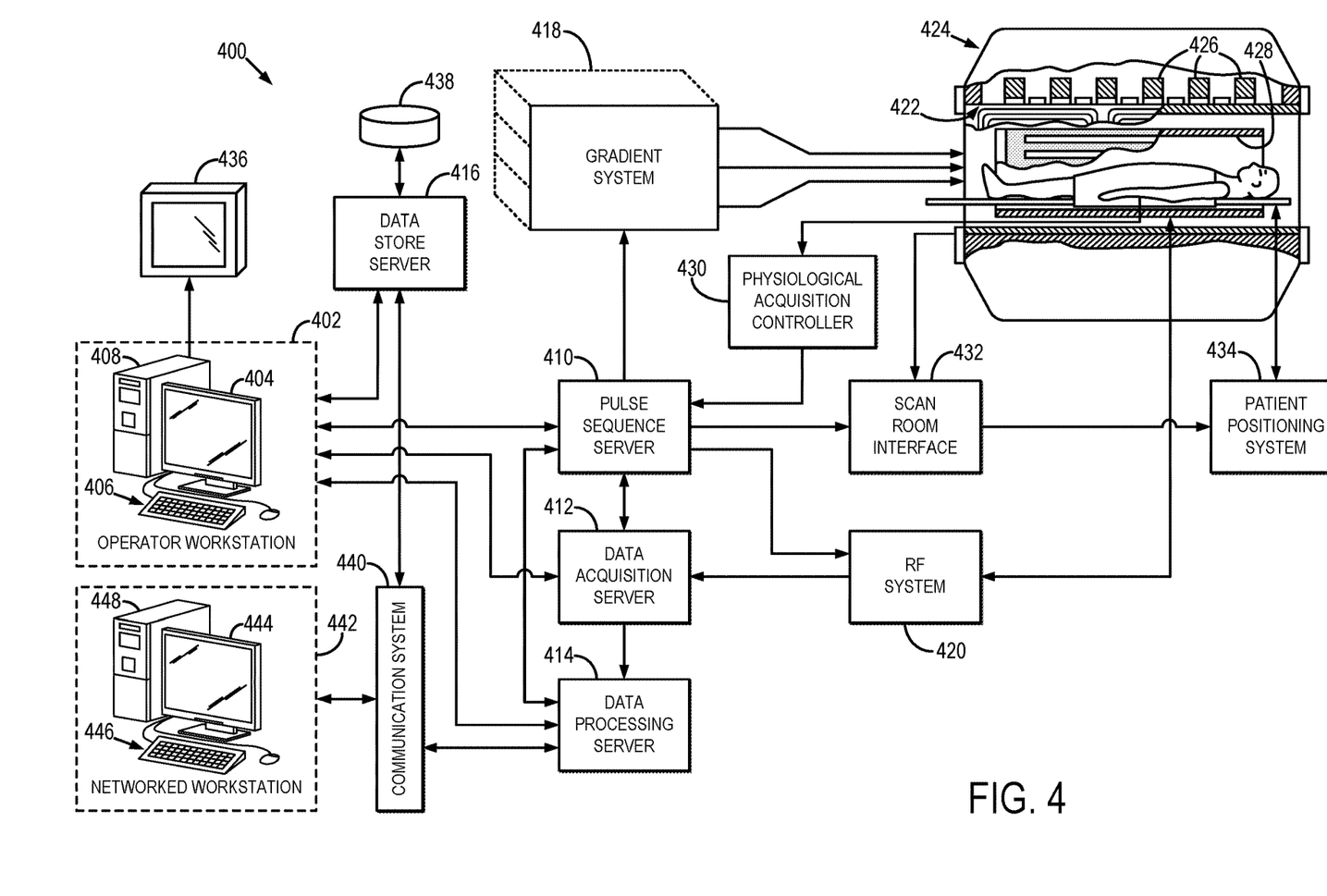
FIG. 4 is a block diagram of an example MRI system that can implement the methods described in the present disclosure.

Referring particularly now to FIG. 4, an example of an MRI system 400 that can implement the methods described here is illustrated. The MRI system 400 includes an operator workstation 402 that may include a display 404, one or more input devices 406 (e.g., a keyboard, a mouse), and a processor 408. The processor 408 may include a commercially available programmable machine running a commercially available operating system. The operator workstation 402 provides an operator interface that facilitates entering scan parameters into the MRI system 400. The operator workstation 402 may be coupled to different servers, including, for example, a pulse sequence server 410, a data acquisition server 412, a data processing server 414, and a data store server 416. The operator workstation 402 and the servers 410, 412, 414, and 416 may be connected via a communication system 440, which may include wired or wireless network connections.

The pulse sequence server 410 functions in response to instructions provided by the operator workstation 402 to operate a gradient system 418 and a radiofrequency ("RF") system 420. Gradient waveforms for performing a prescribed scan are produced and applied to the gradient system 418, which then excites gradient coils in an assembly 422 to produce the magnetic field gradients $G_x$, $G_y$, and $G_z$ that are used for spatially encoding magnetic resonance signals. The gradient coil assembly 422 forms part of a magnet assembly 424 that includes a polarizing magnet 426 and a whole-body RF coil 428.

RF waveforms are applied by the RF system 420 to the RF coil 428, or a separate local coil to perform the prescribed magnetic resonance pulse sequence. Responsive magnetic resonance signals detected by the RF coil 428, or a separate local coil, are received by the RF system 420. The responsive magnetic resonance signals may be amplified, demodulated, filtered, and digitized under direction of commands produced by the pulse sequence server 410. The RF system 420 includes an RF transmitter for producing a wide variety of RF pulses used in MRI pulse sequences. The RF transmitter is responsive to the prescribed scan and direction from the pulse sequence server 410 to produce RF pulses of the desired frequency, phase, and pulse amplitude waveform. The generated RF pulses may be applied to the whole-body RF coil 428 or to one or more local coils or coil arrays.

The RF system 420 also includes one or more RF receiver channels. An RF receiver channel includes an RF preamplifier that amplifies the magnetic resonance signal received by the coil 428 to which it is connected, and a detector that detects and digitizes the I and Q quadrature components of the received magnetic resonance signal. The magnitude of the received magnetic resonance signal may, therefore, be determined at a sampled point by the square root of the sum of the squares of the I and Q components:

$$M=\sqrt{I^2+Q^2} \tag{8}$$

and the phase of the received magnetic resonance signal may also be determined according to the following relationship:

$$\varphi = \tan^{-1}\left(\frac{Q}{I}\right). \tag{9}$$

The pulse sequence server 410 may receive patient data from a physiological acquisition controller 430. By way of example, the physiological acquisition controller 430 may receive signals from a number of different sensors connected to the patient, including electrocardiograph ("ECG") signals from electrodes, or respiratory signals from a respiratory bellows or other respiratory monitoring devices. These signals may be used by the pulse sequence server 410 to synchronize, or "gate," the performance of the scan with the subject's heart beat or respiration.

The pulse sequence server 410 may also connect to a scan room interface circuit 432 that receives signals from various sensors associated with the condition of the patient and the magnet system. Through the scan room interface circuit 432, a patient positioning system 434 can receive commands to move the patient to desired positions during the scan.

The digitized magnetic resonance signal samples produced by the RF system 420 are received by the data acquisition server 412. The data acquisition server 412 operates in response to instructions downloaded from the operator workstation 402 to receive the real-time magnetic resonance data and provide buffer storage, so that data is not lost by data overrun. In some scans, the data acquisition server 412 passes the acquired magnetic resonance data to the data processor server 414. In scans that require information derived from acquired magnetic resonance data to control the further performance of the scan, the data acquisition server 412 may be programmed to produce such information and convey it to the pulse sequence server 410. For example, during pre-scans, magnetic resonance data may be acquired and used to calibrate the pulse sequence performed by the pulse sequence server 410. As another example, navigator signals may be acquired and used to adjust the operating parameters of the RF system 420 or the gradient system 418, or to control the view order in which k-space is sampled. In still another example, the data acquisition server 412 may also process magnetic resonance signals used to detect the arrival of a contrast agent in a magnetic resonance angiography ("MRA") scan. For example, the data acquisition server 412 may acquire magnetic resonance data and processes it in real-time to produce information that is used to control the scan.

The data processing server 414 receives magnetic resonance data from the data acquisition server 412 and processes the magnetic resonance data in accordance with instructions provided by the operator workstation 402. Such processing may include, for example, reconstructing two-dimensional or three-dimensional images by performing a Fourier transformation of raw k-space data, performing other image reconstruction algorithms (e.g., iterative or backprojection reconstruction algorithms), applying filters to raw k-space data or to reconstructed images, generating functional magnetic resonance images, or calculating motion or flow images. Such processing may also include implementing model-based Nyquist ghost correction techniques described in the present disclosure.

Images reconstructed by the data processing server 414 are conveyed back to the operator workstation 402 for storage. Real-time images may be stored in a data base memory cache, from which they may be output to operator display 402 or a display 436. Batch mode images or selected real time images may be stored in a host database on disc storage 438. When such images have been reconstructed and transferred to storage, the data processing server 414 may notify the data store server 416 on the operator workstation 402. The operator workstation 402 may be used by an operator to archive the images, produce films, or send the images via a network to other facilities.

The MRI system 400 may also include one or more networked workstations 442. For example, a networked workstation 442 may include a display 444, one or more input devices 446 (e.g., a keyboard, a mouse), and a processor 448. The networked workstation 442 may be located within the same facility as the operator workstation 402, or in a different facility, such as a different healthcare institution or clinic.

The networked workstation 442 may gain remote access to the data processing server 414 or data store server 416 via the communication system 440. Accordingly, multiple networked workstations 442 may have access to the data processing server 414 and the data store server 416. In this manner, magnetic resonance data, reconstructed images, or other data may be exchanged between the data processing server 414 or the data store server 416 and the networked workstations 442, such that the data or images may be remotely processed by a networked workstation 442.

In some implementations, the operator workstation 402, networked workstation 442, or other suitable computer system may also be used to implement the model-based Nyquist ghost correction techniques described in the present disclosure, to reconstruct images from Nyquist ghost corrected data, or combinations thereof.

Figure 5:
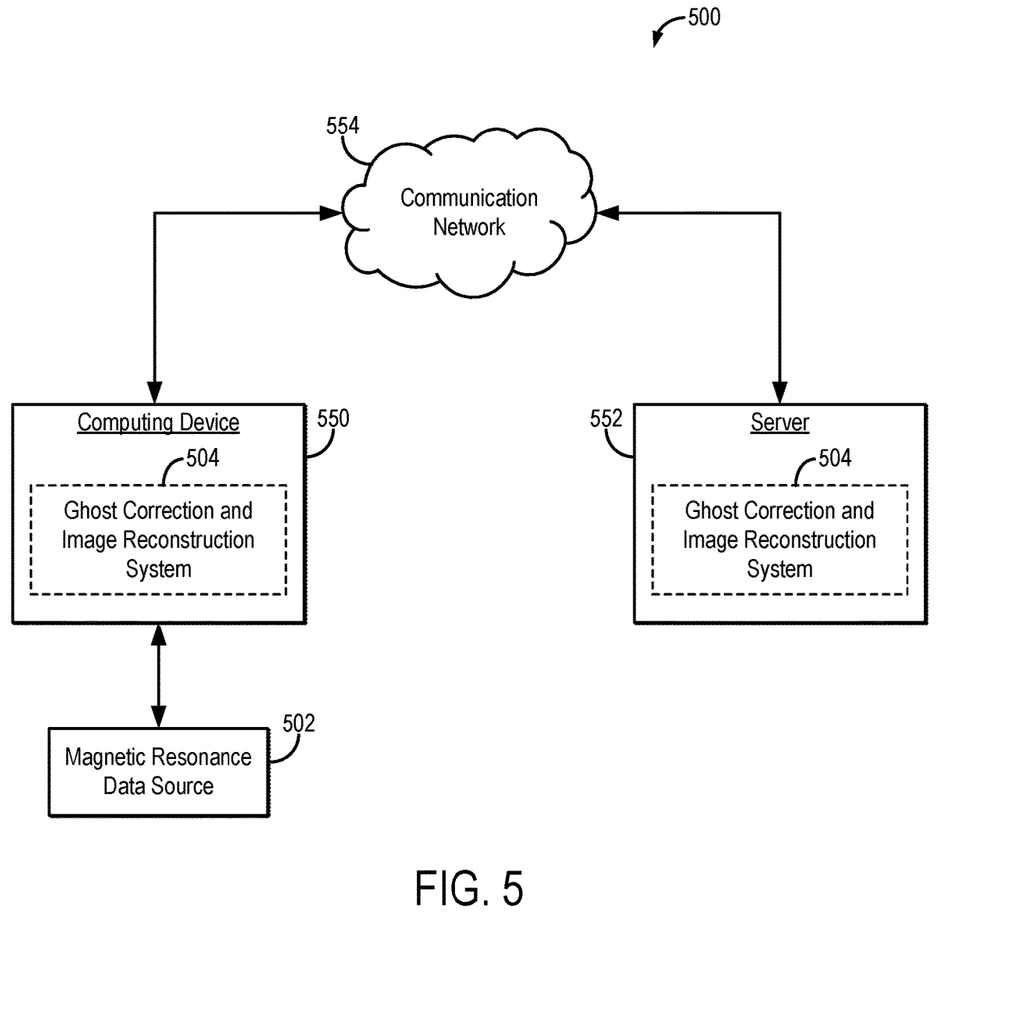
FIG. 5 is a block diagram of an example system that can implement ghost correction and/or image reconstruction according to some embodiments described in the present disclosure.

Referring now to FIG. 5, an example of a system 500 for generating ghost-corrected magnetic resonance data and reconstructing images therefrom, in accordance with some embodiments of the systems and methods described in the present disclosure is shown. As shown in FIG. 5, a computing device 550 can receive one or more types of data (e.g., magnetic resonance data) from magnetic resonance data source 502. In some embodiments, computing device 550 can execute at least a portion of a ghost correction and image reconstruction system 504 to correct magnetic resonance data for ghosting artifacts and to reconstruct images from the ghost-corrected data. As described above, the ghost correction and image reconstruction system 504 can be configured to correct for Nyquist ghost-related errors and/or complex ghosting artifacts due to other factors, such as anisotropic gradient delays; cross-term and higher-order readout eddy currents; and encoding gradient eddy currents (e.g., diffusion lobes).

Additionally or alternatively, in some embodiments, the computing device 550 can communicate information about data received from the magnetic resonance data source 502 to a server 552 over a communication network 554, which can execute at least a portion of the ghost correction and image reconstruction system. In such embodiments, the server 552 can return information to the computing device 550 (and/or any other suitable computing device) indicative of an output of the ghost correction and image reconstruction system 504.

In some embodiments, computing device 550 and/or server 552 can be any suitable computing device or combination of devices, such as a desktop computer, a laptop computer, a smartphone, a tablet computer, a wearable computer, a server computer, a virtual machine being executed by a physical computing device, and so on. The computing device 550 and/or server 552 can also reconstruct images from the data.

In some embodiments, magnetic resonance data source 502 can be any suitable source of magnetic resonance data (e.g., k-space data, images reconstructed from k-space data), such as an MRI system, another computing device (e.g., a server storing image data), and so on. In some embodiments, magnetic resonance data source 502 can be local to computing device 550. For example, magnetic resonance data source 502 can be incorporated with computing device 550 (e.g., computing device 550 can be configured as part of a device for capturing, scanning, and/or storing images). As another example, magnetic resonance data source 502 can be connected to computing device 550 by a cable, a direct wireless link, and so on. Additionally or alternatively, in some embodiments, magnetic resonance data source 502 can be located locally and/or remotely from computing device 550, and can communicate data to computing device 550 (and/or server 552) via a communication network (e.g., communication network 554).

In some embodiments, communication network 554 can be any suitable communication network or combination of communication networks. For example, communication network 554 can include a Wi-Fi network (which can include one or more wireless routers, one or more switches, etc.), a peer-to-peer network (e.g., a Bluetooth network), a cellular network (e.g., a 3G network, a 4G network, etc., complying with any suitable standard, such as CDMA, GSM, LTE, LTE Advanced, WiMAX, etc.), a wired network, and so on. In some embodiments, communication network 554 can be a local area network, a wide area network, a public network (e.g., the Internet), a private or semi-private network (e.g., a corporate or university intranet), any other suitable type of network, or any suitable combination of networks. Communications links shown in FIG. 5 can each be any suitable communications link or combination of communications links, such as wired links, fiber optic links, Wi-Fi links, Bluetooth links, cellular links, and so on.

Figure 6:
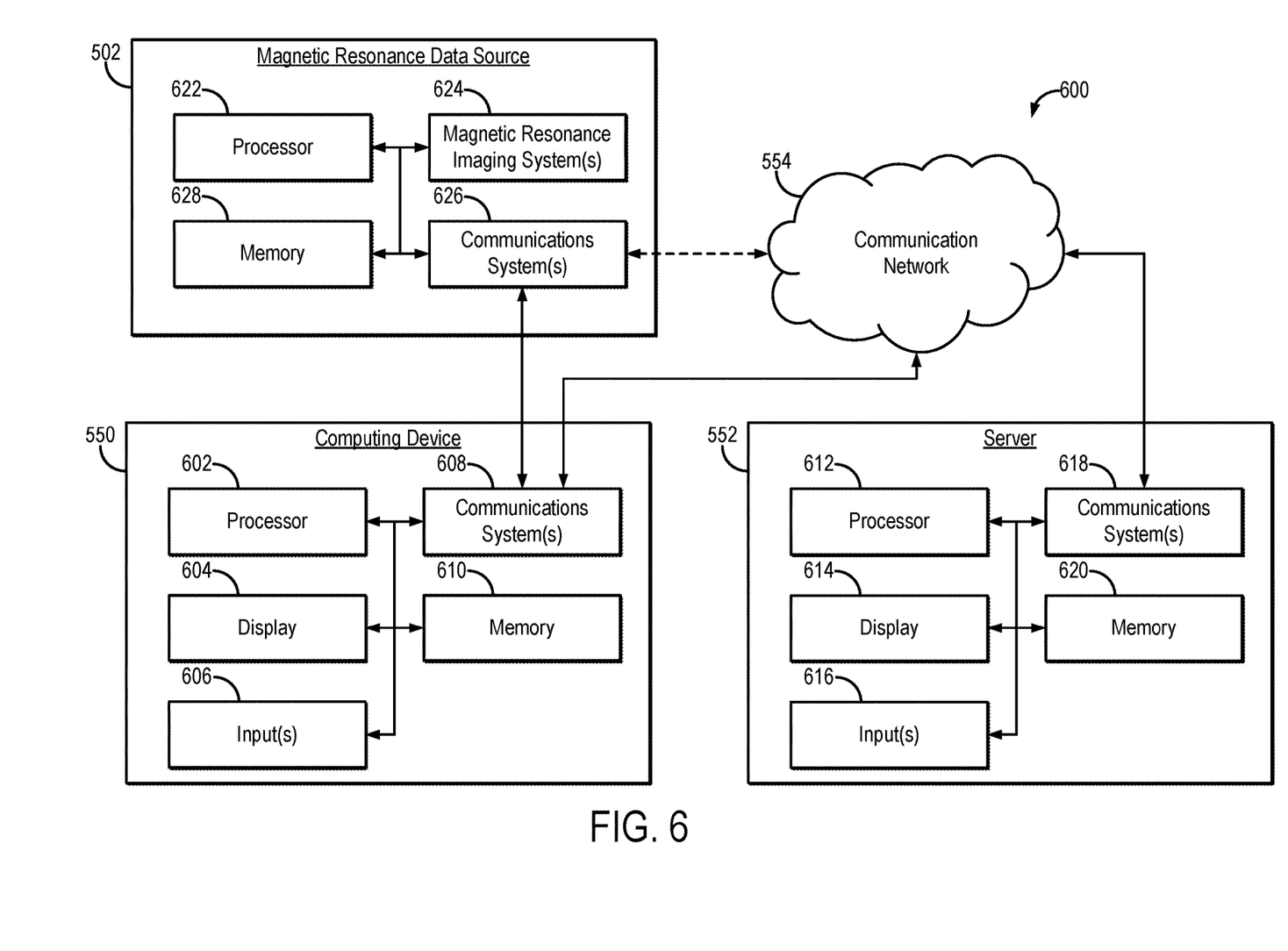
FIG. 6 is a block diagram of example components that can implement the system of FIG. 5.

Referring now to FIG. 6, an example of hardware 600 that can be used to implement magnetic resonance data source 502, computing device 550, and server 552 in accordance with some embodiments of the systems and methods described in the present disclosure is shown. As shown in FIG. 6, in some embodiments, computing device 550 can include a processor 602, a display 604, one or more inputs 606, one or more communication systems 608, and/or memory 610. In some embodiments, processor 602 can be any suitable hardware processor or combination of processors, such as a central processing unit ("CPU"), a graphics processing unit ("GPU"), and so on. In some embodiments, display 604 can include any suitable display devices, such as a computer monitor, a touchscreen, a television, and so on. In some embodiments, inputs 606 can include any suitable input devices and/or sensors that can be used to receive user input, such as a keyboard, a mouse, a touchscreen, a microphone, and so on.

In some embodiments, communications systems 608 can include any suitable hardware, firmware, and/or software for communicating information over communication network 554 and/or any other suitable communication networks. For example, communications systems 608 can include one or more transceivers, one or more communication chips and/or chip sets, and so on. In a more particular example, communications systems 608 can include hardware, firmware and/or software that can be used to establish a Wi-Fi connection, a Bluetooth connection, a cellular connection, an Ethernet connection, and so on.

In some embodiments, memory 610 can include any suitable storage device or devices that can be used to store instructions, values, data, or the like, that can be used, for example, by processor 602 to present content using display 604, to communicate with server 552 via communications system(s) 608, and so on. Memory 610 can include any suitable volatile memory, non-volatile memory, storage, or any suitable combination thereof. For example, memory 610 can include RAM, ROM, EEPROM, one or more flash drives, one or more hard disks, one or more solid state drives, one or more optical drives, and so on. In some embodiments, memory 610 can have encoded thereon, or otherwise stored therein, a computer program for controlling operation of computing device 550. In such embodiments, processor 602 can execute at least a portion of the computer program to present content (e.g., images, user interfaces, graphics, tables), receive content from server 552, transmit information to server 552, and so on.

In some embodiments, server 552 can include a processor 612, a display 614, one or more inputs 616, one or more communications systems 618, and/or memory 620. In some embodiments, processor 612 can be any suitable hardware processor or combination of processors, such as a CPU, a GPU, and so on. In some embodiments, display 614 can include any suitable display devices, such as a computer monitor, a touchscreen, a television, and so on. In some embodiments, inputs 616 can include any suitable input devices and/or sensors that can be used to receive user input, such as a keyboard, a mouse, a touchscreen, a microphone, and so on.

In some embodiments, communications systems 618 can include any suitable hardware, firmware, and/or software for communicating information over communication network 554 and/or any other suitable communication networks. For example, communications systems 618 can include one or more transceivers, one or more communication chips and/or chip sets, and so on. In a more particular example, communications systems 618 can include hardware, firmware and/or software that can be used to establish a Wi-Fi connection, a Bluetooth connection, a cellular connection, an Ethernet connection, and so on.

In some embodiments, memory 620 can include any suitable storage device or devices that can be used to store instructions, values, data, or the like, that can be used, for example, by processor 612 to present content using display 614, to communicate with one or more computing devices 550, and so on. Memory 620 can include any suitable volatile memory, non-volatile memory, storage, or any suitable combination thereof. For example, memory 620 can include RAM, ROM, EEPROM, one or more flash drives, one or more hard disks, one or more solid state drives, one or more optical drives, and so on. In some embodiments, memory 620 can have encoded thereon a server program for controlling operation of server 552. In such embodiments, processor 612 can execute at least a portion of the server program to transmit information and/or content (e.g., data, images, a user interface) to one or more computing devices 550, receive information and/or content from one or more computing devices 550, receive instructions from one or more devices (e.g., a personal computer, a laptop computer, a tablet computer, a smartphone), and so on.

In some embodiments, magnetic resonance data source 502 can include a processor 622, one or more MRI systems 624, one or more communications systems 626, and/or memory 628. In some embodiments, processor 622 can be any suitable hardware processor or combination of processors, such as a CPU, a GPU, and so on. In some embodiments, the one or more MRI systems 624 are generally configured to acquire data, images, or both. For instance, the one or more MRI systems 624 can be configured to acquire magnetic resonance data as k-space data using a reversed readout polarity EPI acquisition, as described above. Additionally or alternatively, in some embodiments, one or more MRI systems 624 can include any suitable hardware, firmware, and/or software for coupling to and/or controlling operations of an MRI system. In some embodiments, one or more portions of the one or more MRI systems 624 can be removable and/or replaceable.

Note that, although not shown, magnetic resonance data source 502 can include any suitable inputs and/or outputs. For example, magnetic resonance data source 502 can include input devices and/or sensors that can be used to receive user input, such as a keyboard, a mouse, a touchscreen, a microphone, a trackpad, a trackball, and so on. As another example, magnetic resonance data source 502 can include any suitable display devices, such as a computer monitor, a touchscreen, a television, etc., one or more speakers, and so on.

In some embodiments, communications systems 626 can include any suitable hardware, firmware, and/or software for communicating information to computing device 550 (and, in some embodiments, over communication network 554 and/or any other suitable communication networks). For example, communications systems 626 can include one or more transceivers, one or more communication chips and/or chip sets, and so on. In a more particular example, communications systems 626 can include hardware, firmware and/or software that can be used to establish a wired connection using any suitable port and/or communication standard (e.g., VGA, DVI video, USB, RS-232, etc.), Wi-Fi connection, a Bluetooth connection, a cellular connection, an Ethernet connection, and so on.

In some embodiments, memory 628 can include any suitable storage device or devices that can be used to store instructions, values, data, or the like, that can be used, for example, by processor 622 to control the one or more MRI systems 624, and/or receive data from the one or more MRI systems 624; to images from data; present content (e.g., images, a user interface) using a display; communicate with one or more computing devices 550; and so on. Memory 628 can include any suitable volatile memory, non-volatile memory, storage, or any suitable combination thereof. For example, memory 628 can include RAM, ROM, EEPROM, one or more flash drives, one or more hard disks, one or more solid state drives, one or more optical drives, and so on. In some embodiments, memory 628 can have encoded thereon, or otherwise stored therein, a program for controlling operation of magnetic resonance data source 502. In such embodiments, processor 622 can execute at least a portion of the program to generate images, transmit information and/or content (e.g., data, images) to one or more computing devices 550, receive information and/or content from one or more computing devices 550, receive instructions from one or more devices (e.g., a personal computer, a laptop computer, a tablet computer, a smartphone, etc.), and so on.

In some embodiments, any suitable computer readable media can be used for storing instructions for performing the functions and/or processes described herein. For example, in some embodiments, computer readable media can be transitory or non-transitory. For example, non-transitory computer readable media can include media such as magnetic media (e.g., hard disks, floppy disks), optical media (e.g., compact discs, digital video discs, Blu-ray discs), semiconductor media (e.g., random access memory ("RAM"), flash memory, electrically programmable read only memory ("EPROM"), electrically erasable programmable read only memory ("EEPROM")), any suitable media that is not fleeting or devoid of any semblance of permanence during transmission, and/or any suitable tangible media. As another example, transitory computer readable media can include signals on networks, in wires, conductors, optical fibers, circuits, or any suitable media that is fleeting and devoid of any semblance of permanence during transmission, and/or any suitable intangible media.

The present disclosure has described one or more preferred embodiments, and it should be appreciated that many equivalents, alternatives, variations, and modifications, aside from those expressly stated, are possible and within the scope of the invention.

The invention claimed is:

1. A method for generating Nyquist ghost corrected magnetic resonance data, the method comprising:
    (a) accessing magnetic resonance data with a computer system, the magnetic resonance data being acquired from a subject with a magnetic resonance imaging (MRI) system using a reversed readout polarity echo planar imaging (EPI) acquisition;
    (b) accessing a signal model with the computer system, wherein the signal model includes a system response function that includes system response parameters associated with phase modulations corresponding to Nyquist ghost artifacts;
    (c) constructing a cost function with the computer system, wherein the cost function is based on the signal model;
    (d) generating estimated system response parameter values by inputting the magnetic resonance data to the cost function and minimizing the cost function with the computer system, generating output as the estimated system response parameter values; and
    (e) generating Nyquist ghost corrected data with the computer system using the estimated system response parameter values.

2. A method for generating corrected magnetic resonance data, the method comprising:
    (a) accessing magnetic resonance data with a computer system, the magnetic resonance data being acquired from a subject with a magnetic resonance imaging (MRI) system using a reversed readout polarity echo planar imaging (EPI) acquisition;
    (b) accessing a signal model with the computer system, wherein the signal model includes a system response function that models phase modulations corresponding to one or more artifacts;
    (c) constructing a cost function with the computer system, wherein the cost function is based on the signal model;
    (d) generating estimated system response parameter values by inputting the magnetic resonance data to the cost function and minimizing the cost function with the computer system, generating output as the estimated system response parameter values; and
    (e) generating corrected data with the computer system using the estimated system response parameter values.

3. The method of claim 1, wherein the system response function separately models positive polarity readout gradients and negative polarity readout gradients.

4. The method of claim 1, wherein the cost function is constructed based in part on a difference between the magnetic resonance data and the system response function applied to an estimate of the Nyquist ghost corrected data.

5. The method of claim 4, wherein constructing the cost function comprises constructing an initial cost function and then reducing a dimensionality of the initial cost function using a variable projection of the estimate of the Nyquist ghost corrected data into the cost function.

6. The method of claim 1, wherein minimizing the cost function includes using a gradient descent.

7. The method of claim 6, wherein the gradient descent is a preconditioned gradient descent.

8. The method of claim 7, wherein the preconditioned gradient descent implements a dense preconditioner.

9. The method of claim 1, further comprising reconstructing an image from the Nyquist ghost corrected data, the image depicting the subject with significantly mitigated Nyquist ghost artifacts.

10. The method of claim 1, wherein the reversed readout polarity EPI acquisition comprises two sequential phase-encoded EPI acquisitions whose readout gradient polarities have opposite signs at onset.

11. The method of claim 2, wherein the system response function accounts for phase modulations that correspond to readout gradient induced eddy currents.

12. The method of claim 11, wherein the system response function accounts for phase modulations that correspond to low-order readout gradient induced eddy currents.

13. The method of claim 2, wherein the system response function accounts for phase modulations that correspond to group delays caused by receive chain imperfections of the MRI system used to acquire the magnetic resonance data.

14. The method of claim 2, wherein the system response function accounts for phase modulations that correspond to Nyquist ghost artifacts.

15. The method of claim 2, wherein the system response function in the signal model models phase modulations corresponding to anisotropic gradient delays.

16. The method of claim 2, wherein the system response function in the signal model models phase modulations corresponding to cross-term readout gradient induced eddy currents.

17. The method of claim 2, wherein the system response function in the signal model models phase modulations corresponding to encoding gradient induced eddy currents.

18. The method of claim 2, further comprising reconstructing an image from the corrected data, the image depicting the subject with significantly mitigated artifacts associated with the phase modulations modeled by the signal model.

19. The method of claim 2, wherein the reversed readout polarity EPI acquisition comprises two sequential phase-encoded EPI acquisitions whose readout gradient polarities have opposite signs at onset.

* * * * *